US012448684B2

(12) United States Patent
Hagiwara et al.

(10) Patent No.: US 12,448,684 B2
(45) Date of Patent: Oct. 21, 2025

(54) OXIDE FILM FORMATION METHOD

(71) Applicant: MEIDEN NANOPROCESS INNOVATIONS, INC., Tokyo (JP)

(72) Inventors: Takayuki Hagiwara, Matsudo (JP); Naoto Kameda, Moriya (JP)

(73) Assignee: MEIDEN NANOPROCESS INNOVATIONS, INC., Tokyo (JP)

( * ) Notice: Subject to any disclaimer, the term of this patent is extended or adjusted under 35 U.S.C. 154(b) by 0 days.

(21) Appl. No.: 18/996,539

(22) PCT Filed: Jun. 22, 2023

(86) PCT No.: PCT/JP2023/023049
§ 371 (c)(1),
(2) Date: Jan. 17, 2025

(87) PCT Pub. No.: WO2024/018811
PCT Pub. Date: Jan. 25, 2024

(65) Prior Publication Data
US 2025/0257452 A1 Aug. 14, 2025

(30) Foreign Application Priority Data
Jul. 20, 2022 (JP) ................................ 2022-115198

(51) Int. Cl.
*C23C 16/40* (2006.01)
*C23C 16/44* (2006.01)
*C23C 16/455* (2006.01)

(52) U.S. Cl.
CPC .......... *C23C 16/40* (2013.01); *C23C 16/4408* (2013.01); *C23C 16/45534* (2013.01)

(58) Field of Classification Search
CPC ................ C23C 16/40; C23C 16/4408; C23C 16/45534
See application file for complete search history.

(56) References Cited

U.S. PATENT DOCUMENTS 10,978,293 B2 4/2021 Kameda et al.
11,414,755 B2 8/2022 Kameda et al.
(Continued)

FOREIGN PATENT DOCUMENTS

JP 6569831 B1 9/2019
JP 2020004818 A * 1/2020
(Continued)

OTHER PUBLICATIONS

Machine translation, JP-2020004818-A (Year: 2020).*
(Continued)

*Primary Examiner* — Michael G Miller
(74) *Attorney, Agent, or Firm* — Foley & Lardner LLP

(57) ABSTRACT

An oxide film formed on a film formation surface of a film formation target housed in a chamber includes a first film formed on the film formation surface and a second film formed on a first film surface. The first film is formed on the film formation surface of the film formation target by an ALD first film formation method that uses only an at least 80 volume % ozone gas as an oxidizing agent. The second film is formed on the first film surface by an ALD or CVD second film formation method that is different from the first film formation method. The second film formation method uses OH radicals generated by a radical reaction between high-concentration ozone gas and unsaturated hydrocarbon gas as an oxidizing agent and makes use of the oxidizing power of the radicals to form the oxide film.

7 Claims, 4 Drawing Sheets

(56) References Cited

U.S. PATENT DOCUMENTS

| | | | | |
|---|---|---|---|---|
| 2021/0028011 | A1* | 1/2021 | Kameda | ............ C23C 16/45512 |
| 2022/0090262 | A1* | 3/2022 | Kameda | ............ C23C 16/45565 |
| 2024/0060179 | A1 | 2/2024 | Kameda et al. | |

FOREIGN PATENT DOCUMENTS

| | | | | |
|---|---|---|---|---|
| JP | 6677356 | B1 | 4/2020 | |
| JP | 2022-053787 | A | 4/2022 | |
| JP | 7056710 | B2 | 4/2022 | |
| JP | 2022-087800 | A | 6/2022 | |
| WO | WO-2019/187337 | A1 | 10/2019 | |
| WO | WO-2020/170482 | A1 | 8/2020 | |
| WO | WO-2022064849 | A1 * | 3/2022 | ........... C23C 16/455 |

OTHER PUBLICATIONS

Machine translation, WO-2022064849 (Year: 2022).*

Nishiguchi et al., "Rapid and Uniform $SiO_2$ Film Growth on 4 inch Si Wafer Using 100%-$O_3$ Gas", Japanese Journal of Applied Physics, Jan. 11, 2005, pp. 118-124, vol. 44, No. 1A.

* cited by examiner (A) Ra:0.2nm (B) Ra:0.2nm

OXIDE FILM FORMATION METHOD

TECHNICAL FIELD

The present invention relates to an oxide film formation method such as an art applicable to an oxide film formed on a film formation surface of a film formation target low in heat resistance.

BACKGROUND ART

Known representative methods for forming thin films for advanced devices such as a semiconductor device for a CPU circuit include vapor deposition, sputtering, Chemical Vapor Deposition (CVD), Atomic Layer Deposition (ALD), etc. In particular, the film formation method by ALD is indispensable as a thin film formation mean for advanced devices because of a possibility for achieving superior film characteristics such as step coverage, denseness, insulation quality, and relative dielectric constant.

In general, the ALD film formation method is mainly performed by repeating four processes of: a process for vacuum evacuation of an entire chamber (e.g., a vacuum container) containing a film formation target (e.g., a silicon wafer); a process for introducing raw material gas (e.g., trimethylaluminum (TMA)) for ALD into the chamber; a process for removing the raw material gas from the chamber; and a process for supplying an oxidizer (e.g., water vapor or oxygen plasma) of the raw material gas to the chamber.

The introduction of the raw material gas into the chamber fills the chamber with the raw material gas, and causes a film formation surface of the film formation target to adsorb an amount corresponding to one-molecular layer of the raw material gas so as to form a molecular layer of the raw material gas on the film formation surface of the film formation target. The supply of the oxidizer of the raw material gas to the chamber oxidizes the molecular layer of the raw material gas formed on the film formation surface, and forms a molecular layer of an oxide film of the raw material gas (e.g., an aluminum oxide film) on the film formation surface. The repeat of the above four processes forms a thin film having a film thickness depending on the number of the repeat.

The ALD film formation method tends to increase in film formation temperature. For example, in case of employing TMA as the raw material gas, it is required to heat the film formation target to a relatively high temperature such as 300° C. to 500° C. in order to cause the TMA to sufficiently react with water vapor. To lower the film formation temperature, one method having been considered is replacing of the oxidizer for ALD with ozone ($O_3$) or oxygen plasma and utilizing of radicals yielded by the oxidizer. The ozone yields O radicals being a powerful oxidizer upon thermal decomposition, but still requires heating of the film formation target to a several hundred ° C.

The oxygen plasma supplies O radicals from the beginning, and has been considered to achieve the temperature-lowering most. The oxygen plasma actually lowers the film formation temperature to about 100° C. to 150° C. However, the oxygen plasma is highly reactive for ashing etc., and may cause the film formation target to undergo deformation (i.e., removal etc.) and/or denaturation (i.e., degeneration etc.) in case that the film formation target is low in heat resistance (e.g., one made of a low-heat-resistance material such as a resist formed on a substrate surface).

Recently, devices capable of generating ozone gas of a high concentration (e.g., 80 volume % or higher) have appeared and brought various considerations for using such high-concentration ozone gas as an oxidizer for CVD or ALD and forming an oxide film with intended film characteristics while maintaining a film formation target relatively low (e.g., at or below 100° C.) in temperature. For example, see Patent Documents 1 to 4 and Non-patent Document 1.

PRIOR ART DOCUMENT(S)

Patent Document(s)

Patent Document 1: JP 7056710 B2
Patent Document 2: JP 2022-087800 A
Patent Document 3: JP 6677356 B1
Patent Document 4: JP 6569831 B1

Non-Patent Document(s)

Non-patent Document 1: T. Nishiguchi, Y. Sato, H. Nonaka, S. Ichimura, T. Noyori, Y. Morikawa, M. Kekura, and Y. Nihei, Jpn. J. Appl. Phys. 44, 118 (2005).

SUMMARY OF THE INVENTION

Each of Patent Documents 1 and 2 shows an ALD film formation method employing only high-concentration ozone gas as an oxidizer for ALD, which has a possibility for forming an oxide film with intended film characteristics even on a film formation surface of a low-heat-resistance film formation target, because of easiness for setting a film formation temperature at or below 100° C. and low reactivity of the high-concentration ozone gas for ashing etc. However, these methods tend to increase in film formation time and decrease in film formation efficiency, especially in case of forming an oxide film greater in film thickness.

Each of an ALD film formation method of Patent Document 3 and a CVD film formation method of Patent Document 4 shows employing both of high-concentration ozone gas and unsaturated hydrocarbon gas as oxidizers for ALD or CVD and performing film formation with utilization of oxidation power of radicals (i.e., OH radicals) yielded by a radical reaction between the high-concentration ozone gas and the unsaturated hydrocarbon gas. This facilitates setting of a film formation temperature at or below 100° C., facilitates maintenance of a film formation speed fast in comparison with Patent Documents 1 and 2, and has a possibility for improvement in film formation efficiency. However, the radicals yielded by the radical reaction are more reactive for ashing etc. than high-concentration ozone gas, and may considerably deform, denature, etc. a low-heat-resistance film formation target. This complicates achievement of intended film characteristics.

In view of the foregoing circumstances, it is desirable to provide an art that serves to facilitate achievement of an intended film formation efficiency and intended film formation characteristics.

According to one aspect of the present invention serving for solving the above problem, an oxide film formation method for forming an oxide film on a film formation surface of a film formation target contained in a chamber includes forming the oxide film such that the oxide film includes a first film formed on the film formation surface and a second film formed on a surface of the first film.

The first film is formed by a first film formation method being an atomic layer deposition method and including a first raw material gas supply process, a first raw material gas purge process, a first oxidizer supply process, and a first oxidizer purge process. The first raw material gas supply process includes supplying to an inside of the chamber, raw material gas containing an element to compose the oxide film, and forming a first adsorption layer of the raw material gas on the film formation surface. The first raw material gas purge process includes removing from the film formation surface, excess gas of the raw material gas supplied in the first raw material gas supply process and gas yielded due to adsorption of the raw material gas on the film formation surface. The first oxidizer supply process includes supplying ozone gas of 80 volume % or higher to the inside of the chamber and oxidizing the first adsorption layer. The first oxidizer purge process includes removing from the film formation surface, excess gas of the ozone gas supplied in the first oxidizer supply process and gas yielded due to oxidation of the first adsorption layer.

The second film is formed by a second film formation method being an atomic layer deposition method different from the first film formation method or being a chemical vapor deposition method. The second film formation method employs as an oxidizer, radicals yielded by a radical reaction between ozone gas of 80 volume % or higher and unsaturated hydrocarbon gas.

In case that the second film formation method is the atomic layer deposition method different from the first film formation method, the second film formation method may include a second raw material gas supply process, a second raw material gas purge process, a second oxidizer supply process, and a second oxidizer purge process. The second raw material gas supply process may include supplying to the inside of the chamber, raw material gas containing the element to compose the oxide film, and forming a second adsorption layer of the raw material gas on the surface of the first film. The second raw material gas purge process may include removing from the surface of the first film, excess gas of the raw material gas supplied in the second raw material gas supply process and gas yielded due to adsorption of the raw material gas on the surface of the first film. The second oxidizer supply process may include supplying the ozone gas of 80 volume % or higher and the unsaturated hydrocarbon gas to the inside of the chamber and oxidizing the second adsorption layer. The second oxidizer purge process may include removing from the surface of the first film, excess gas of the ozone gas and the unsaturated hydrocarbon gas supplied in the second oxidizer supply process and gas yielded due to oxidation of the second adsorption layer.

In case that the second film formation method is the chemical vapor deposition method, the second film formation method may include supplying to the inside of the chamber, the ozone gas of 80 volume % or higher and the unsaturated hydrocarbon gas and raw material gas containing the element to compose the oxide film.

The first film may have a film thickness of 2 nm or thicker. The film formation target may be maintained at or below 100° C. in temperature.

The film formation target may be made of a resin or a low-heat-resistance glass having a curing temperature or a glass translation temperature Tg of 200° C. or lower.

Each of the first film and the second film may be an oxide film composed of one selected from a group of $Al_2O_3$, $HfO_2$, $TiO_2$, $ZnO$, $Ta_2O_3$, $Ga_2O_3$, $MoO_3$, $RuO_2$, $SiO_2$, $ZrO_2$, and $Y_2O_3$, or an oxide film composed of the selected one an element except O of which is partially replaced with another element.

The chamber may include: a raw material gas supply structured to supply the raw material gas to the inside of the chamber; an ozone gas supply structured to supply the ozone gas to the inside of the chamber; an unsaturated hydrocarbon gas supply structured to supply the unsaturated hydrocarbon gas to the inside of the chamber; and a gas outlet structured to suck gas inside the chamber and discharge the gas into an outside of the chamber. Each of the first film and the second film may be formed in a state in which the inside of the chamber is decompressed.

The above aspect of the present invention serves to facilitate achievement of an intended film formation efficiency and intended film formation characteristics.

MODE(S) FOR CARRYING OUT THE INVENTION

Figure 1:
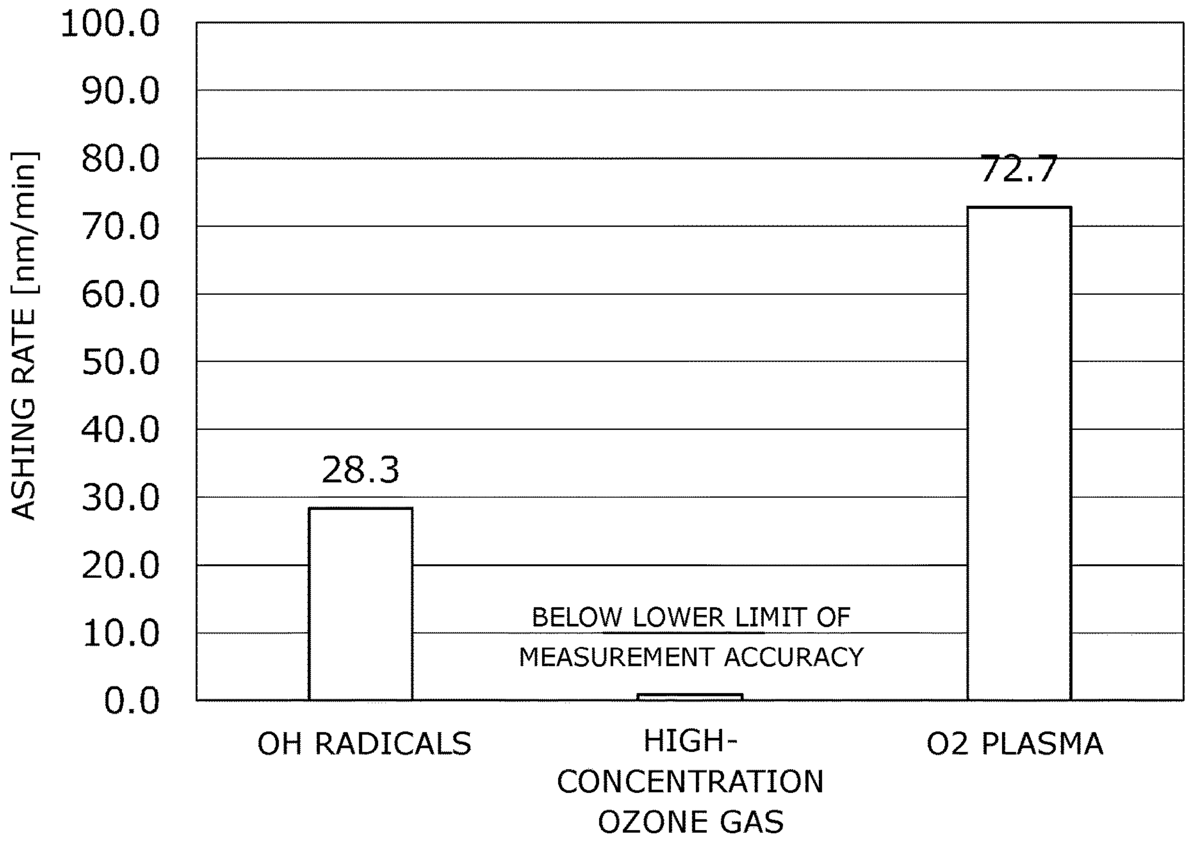
FIG. 1 shows an example of ashing rates of a resist by oxidizers including a high-concentration ozone gas, an oxygen plasma, and OH radicals.

An oxide film formation method according to the present invention is clearly different from an oxide film formation method (hereinafter, simply referred to as a conventional method) merely employing one of general film formation methods such as ALD and CVD, and employs a plurality of film formation methods including ALD and CVD and thereby forms an oxide film in stages.

The present embodiment discloses an oxide film formation method configured to form an oxide film on a film formation surface of a film formation target contained in a chamber, wherein the oxide film includes a first film formed on the film formation surface and a second film formed on a surface of the first film.

The first film is formed on the film formation surface of the film formation target by a first film formation method, i.e., a method employing only ozone gas of 80 vol % or higher (hereinafter, simply referred to as a high-concentration ozone gas) as an oxidizer for ALD, similarly to the ALD film formation methods disclosed in Patent Documents 1 and 2.

The second film is formed on the surface of the first film by a second film formation method that is an ALD method different from the first film formation method or is a CVD method. What is applicable as the second film formation method is a method configured to employ as oxidizers for ALD or CVD, radicals (i.e., OH radicals) yielded by a radical reaction between high-concentration ozone gas and unsaturated hydrocarbon gas, and perform film formation with utilization of oxidation power of the radicals.

The method of forming the oxide film in stages according to the present embodiment forms the first film on the film formation surface of the film formation target, and thereby serves to suppress the film formation target from undergoing deformation, denaturation, etc. This facilitates suppression of deformation, denaturation etc. of the film formation target, even upon implementing the second film formation method faster in film formation speed than the first film formation method, for forming the second film after formation of the first film: e.g., even upon implementing the method of utilizing oxidation power of radicals yielded by a radical reaction between high-concentration ozone gas and unsaturated hydrocarbon gas, for forming the second film.

Thus, the present embodiment facilitates formation of an oxide film with an intended film thickness and intended film characteristics even in case of a film formation target low in heat resistance (e.g., one made of a low-heat-resistance material such as a resist formed on a substrate surface), and allows achievement of a sufficient film formation efficiency.

The oxide film formation method according to the present embodiment may be variously configured as long as implementing two kinds of film formation methods such as ALD and CVD and forming an oxide film in stages: e.g., implementing the first film formation method and the second film formation method and thereby forming the oxide film including the first film and the second film, as described above. Thus, it may be modified in design by appropriately applying common general technical knowledge of various fields such as a field of film formation including ALD and CVD, a field of chambers, a field of gas supply and gas discharge, etc., with appropriate reference to prior art documents as needed. The following embodiment shows an example thereof, where same contents are represented by same reference numerals for appropriate omission of detailed explanation.

Embodiments

<Reference Example of ALD and CVD Applicable as First and Second Film Formation Methods>

Table 1 below shows results of film formation speed GPC (i.e., Growth Per Cycle) in a test of forming an oxide film of $SiO_2$ on a substrate. The test applied the ALD film formation method disclosed in Patent Documents 1 and 2, and employed tris(dimethylamino) silane (3DMAS) as raw material gas and employed high-concentration gas or OH radicals as an oxidizer.

TABLE 1

| OXIDIZER | GPC [bn/cycle] |
|---|---|
| HIGH-CONCENTRATION OZONE GAS | 0.04 |
| OH RADICALS | 0.09 |

Table 1 shows that the film formation speed in case of employing only the high-concentration gas as the oxidizer is slower than the film formation speed in case of employing the OH radicals as the oxidizer. In addition, it is considered that increase in film thickness of the oxide film tends to cause increase in film formation time and decrease in film formation efficiency.

The ozone gas is low in reactivity for ashing etc. under a temperature atmosphere of 100° C. or lower. This reduces deformation, denaturation, etc. possible in a low-heat-resistance film formation target such as a resist up to an ignorable extent (e.g., an ashing speed of 1 nm/minute or slower), even if the low-heat-resistance film formation target is exposed to the ozone gas.

FIG. 1 shows observation results of an ashing rate of a resist by respective oxidizers in the ALD film formation method configured to: employ as a film formation target the resist formed on a surface of a substrate and contained in a chamber together with the substrate; and form the oxide film with use of one of high-concentration ozone gas, oxygen plasma, and OH radicals as the oxidizer.

The results in FIG. 1 show that the case of employing the high-concentration gas as the oxidizer is sufficiently smaller (to fall below a lower limit of measurement accuracy) in ashing rate than the case of employing the oxygen plasma or the OH radicals as the oxidizer, and has little impact on the resist.

The high-concentration ozone gas under a temperature atmosphere of 100° C. hardly undergoes a decomposition reaction that is caused due to a collision reaction between oxygen molecules and ozone molecules in gas phase. This allows the chamber to maintain a high ozone gas concentration for a long time (e.g., over 10000 hours after sealing), in case of supplying the high-concentration ozone gas to the resist inside the chamber, sealing the chamber, and maintaining a temperature inside the chamber at or below 100° C. (see Non-patent Document 1). This suppresses the ozone molecules inside the chamber from being decomposed during gas-phase conveyance toward a surface of the resist, and allows the ozone molecules to reach the resist sufficiently.

Thus, the first film formation method configured to employ high-concentration ozone gas as an oxidizer serves to form the first film on the film formation surface with a sufficient step coverage, even in case that the film formation surface is shaped uneven as exemplified by a film formation target S in FIG. 2 described below. This suppresses the film formation target from undergoing deformation, denaturation, etc.

Figure 2:
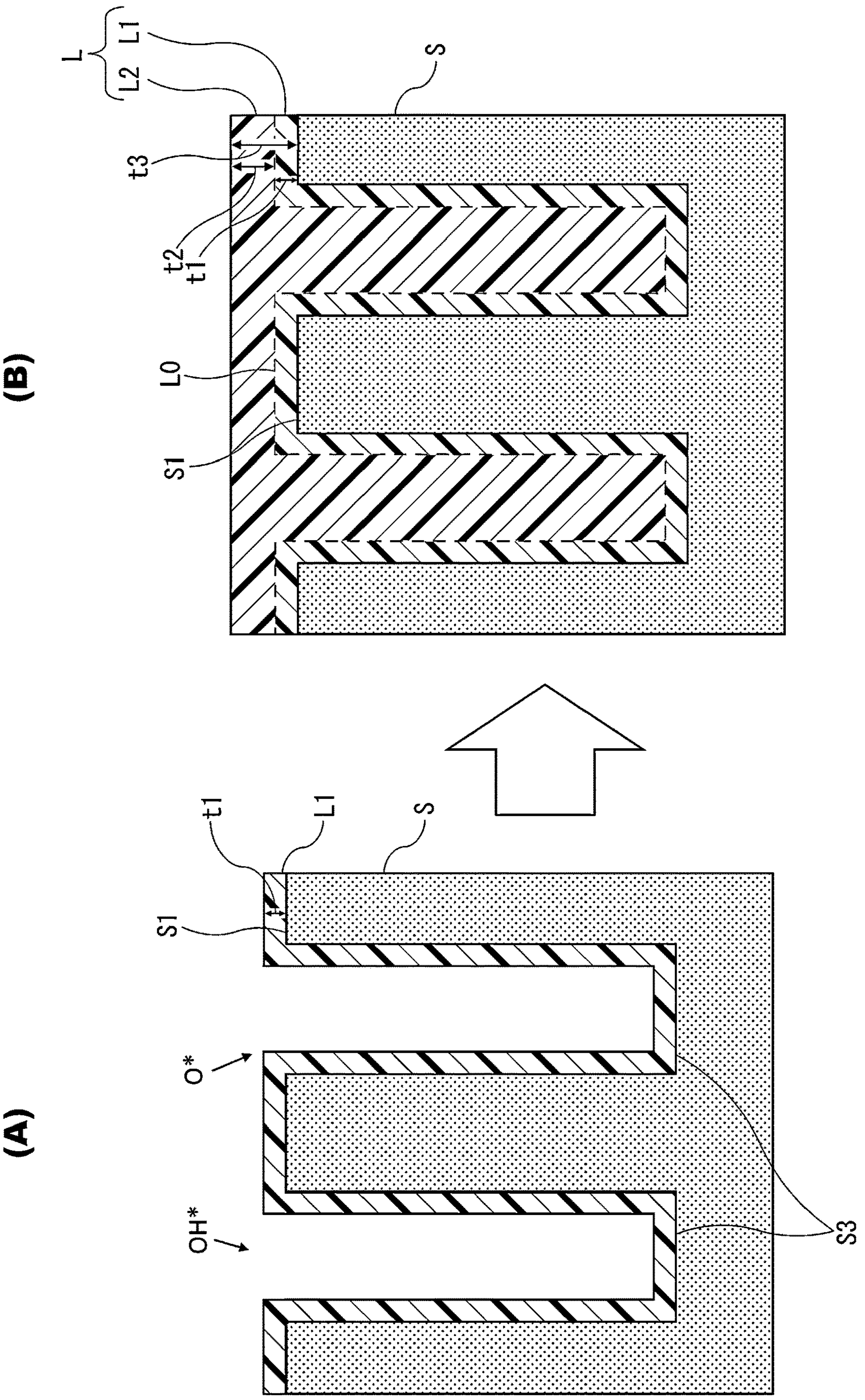
FIG. 2 is a schematic sectional view in a direction of film thickness, for illustration of a first film formation method and a second film formation method. (A) and (B) respectively show an early stage and a late stage of film formation.

Film formation target S in FIG. 2 is exemplarily a resist shaped uneven in an intended pattern on a surface of a substrate (e.g., an Si substrate in FIG. 3 described below). The following describes film formation processes for forming an oxide film L with an intended film thickness (i.e., thickness t3 in FIG. 2) on a film formation surface S1 of film formation target S by the ALD film formation method employing high-concentration ozone gas.

First, in an early stage of the film formation shown in FIG. 2(A), oxide film L formed on film formation surface S1 is relatively thin in film thickness. Specifically, in a state of FIG. 2(A), a first film L1 having a film thickness t1 is formed. In this state, ozone having diffused inside the oxide film L (i.e., in-film diffusion) may reach film formation surface S1 and cause film formation surface S1 to be exposed to the ozone (hereinafter, simply referred to as in-film diffusion exposure). However, the in-film diffusion exposure is suppressed to a certain degree, depending on the film thickness of oxide film L. Next, in a late stage of the film formation shown in FIG. 2(B), the in-film diffusion exposure is further suppressed and reduced, as the film thickness of oxide film L approaches the intended film thickness (i.e., as a second film L2 having a film thickness t2 is formed, in case of FIG. 2(B)).

Thus, after first film L1 being a part of oxide film L is formed on film formation surface S1 as shown in FIG. 2(A), the in-film diffusion exposure is suppressed and reduced depending on the film thickness of first film L1 even if employing a reactant large in reactivity to a certain extent (e.g., an ashing speed of 1 nm/minute or faster) as the oxidizer upon the second film formation method for forming second film L2 being the remainder of oxide film L.

In case of employing large-valence radicals such as ones applied in high-energy plasma, ion-sputtering, etc. as the oxidizer for the second film formation method, such oxidizer may cause deformation, denaturation, etc. of first film L1 and film formation target S. On the other hand, the employment of OH radicals yielded by a radical reaction between high-concentration ozone gas and unsaturated hydrocarbon gas serves to suppress such deformation, denaturation, etc., and sufficiently preserve the intended pattern of unevenness formed on film formation surface S1 of film formation target S.

Thus, the employment of radicals yielded by a radical reaction as the oxidizer for the second film formation method serves to suppress deformation, denaturation, etc. of first film L1 and film formation target S, while increasing the second film formation method in film formation speed to be faster than the first film formation method and thereby shortening a film formation time for forming the entire part of oxide film L.

The above description shows that the first film formation method and the second film formation method facilitate achievement of intended film characteristics and an intended film formation efficiency.

<Example of First Film Formation Method>

The first film formation method is the method of employing only high-concentration ozone gas as an oxidizer for ALD, similarly to the ALD film formation methods disclosed in Patent Documents 1 and 2, and may be variously modified provided that first film L1 is formed on film formation surface S1 of film formation target S as exemplified in FIG. 2(A).

As an example, the first film formation method appropriately employs an ALD device as disclosed in Patent Documents 1 and 2 (i.e., ALD devices represented by reference numeral 11 in Patent Documents 1 and 2), and includes a first raw material gas supply process, a first raw material gas purge process, a first oxidizer supply process, and a first oxidizer purge process as described below.

First, the first raw material gas supply process is performed by supplying raw material gas containing an element(s) to compose oxide film L to be formed, to an inside of a chamber containing film formation target S (e.g., chamber 2 in FIG. 3 described below). This causes the raw material gas to be adsorbed on film formation surface S1 of film formation target S inside the chamber and form an adsorption layer of the raw material gas. In case of adhesion of an impurity etc. to film formation surface S1 of film formation target S, it is favorable to clean film formation surface S1 (e.g., by purging by supplying an inert gas to the chamber) before the first raw material gas supply process and thereby facilitate adsorption of the raw material gas on film formation surface S1.

After the first raw material gas supply process, the first raw material gas purge process is performed by supplying inert gas to the inside of the chamber and discharging gas inside the chamber into an outside of the chamber. This removes from film formation surface S1, excess gas of the raw material gas supplied in the first raw material gas supply process and gas yielded due to adsorption of the raw material gas on film formation surface S1.

Next, the first oxidizer supply process is performed by supplying high-concentration ozone gas to the inside of the chamber. This oxidizes the adsorption layer formed on film formation surface S1, and forms an adsorbable region (e.g., an adsorbable region 20*a* in Patent Document 1) for film formation next time on film formation surface S1.

Finally, the first oxidizer purge process is performed by supplying inert gas to the inside of the chamber and discharging gas inside the chamber into the outside of the chamber, similarly to the first raw material gas purge process. This removes from film formation surface S1, excess gas of the high-concentration ozone gas supplied in the first oxidizer supply process and gas yielded due to oxidation of the adsorption layer on film formation surface S1.

The above ALD processes compose a cycle (hereinafter, simply referred to as a first film formation cycle) to be repeated. The repeat of the first film formation cycle allows first film L1 to be formed with an intended thickness (e.g., thickness t1 in FIG. 2) on film formation surface S1. Various film formation conditions of the first film formation cycle may be appropriately set depending on oxide film L to be formed.

<Example of Second Film Formation Method>

The second film formation method may be variously configured as a method different from the first film formation method, provided that second film L2 is formed on first film surface L0 of first film L1 as exemplarily shown in FIG. 2(B).

As an example, the second film formation method is configured to perform film formation by utilizing as an oxidizer for ALD, oxidation power of radicals (i.e., OH radicals) yielded by a radical reaction between high-concentration ozone gas and unsaturated hydrocarbon gas, similarly to the ALD film formation method disclosed in Patent Document 3.

Specifically, the present example of the second film formation method appropriately employs an ALD device as disclosed in Patent Document 3 (i.e., an ALD device represented by reference numeral 1A in Patent Document 3), and includes a second raw material gas supply process, a second raw material gas purge process, a second oxidizer supply process, and a second oxidizer purge process as described below.

First, the second raw material gas supply process is performed by supplying raw material gas containing an element(s) to compose oxide film L to be formed, to an inside of a chamber (e.g., chamber 2 in FIG. 3 described below) containing film formation target S that includes first film L1 formed beforehand by the first film formation method. This causes the raw material gas to be adsorbed on first film surface L0 of film formation target S inside the chamber and form an adsorption layer of the raw material gas. In case of adhesion of an impurity etc. to first film surface L0 of film formation target S, it is favorable to clean first film surface L0 (e.g., by purging by supplying an inert gas to the chamber) before the second raw material gas supply process and thereby facilitate adsorption of the raw material gas on first film surface L0.

After the second raw material gas supply process, the second raw material gas purge process is performed by supplying inert gas to the inside of the chamber and discharging gas inside the chamber into an outside of the chamber. This removes from first film surface L0, excess gas of the raw material gas supplied in the second raw material gas supply process and gas yielded due to adsorption of the raw material gas on first film surface L0.

Next, the second oxidizer supply process is performed by supplying both of the high-concentration ozone gas and the unsaturated hydrocarbon gas to the inside of the chamber. This yields the OH radicals by the radical reaction between the high-concentration ozone gas and the unsaturated hydrocarbon gas inside the chamber. The OH radicals oxidize the adsorption layer formed on first film surface L0, and form an adsorbable region (e.g., a region including OH groups in FIG. 7(C) of Patent Document 3) for film formation next time on first film surface L0.

Finally, the second oxidizer purge process is performed by supplying inert gas to the inside of the chamber and discharging gas inside the chamber into the outside of the chamber, similarly to the second raw material gas purge process. This removes from first film surface L0, excess gas of the high-concentration ozone gas and the unsaturated hydrocarbon gas supplied in the second oxidizer supply process and gas yielded by the oxidation of the adsorption layer on first film surface L0.

The above ALD processes compose a cycle (hereinafter, simply referred to as a second film formation cycle) to be repeated. The repeat of the second film formation cycle allows second film L2 to be formed with an intended thickness (e.g., thickness t2 in FIG. 2) on first film surface L0. Various film formation conditions of the second film formation cycle may be appropriately set depending on oxide film L to be formed.

<Another Example for Second Film Formation Method>

The second film formation method may be performed also by utilizing as an oxidizer for CVD, oxidation power of radicals (i.e., OH radicals) yielded by a radical reaction between high-concentration ozone gas and unsaturated hydrocarbon gas, similarly to the CVD film formation method disclosed in Patent Document 4.

Specifically, this may be performed by appropriately employing a CVD device as disclosed in Patent Document 4 (i.e., CVD devices represented by reference numerals 11 and 13 in Patent Document 4). This method of employing the CVD device supplies by CVD the high-concentration ozone gas, the unsaturated hydrocarbon gas, and raw material gas containing an element(s) to compose oxide film L to be formed, to an inside of a chamber (e.g., chamber 2 in FIG. 3 described below) containing film formation target S that includes first film L1 formed beforehand by the first film formation method.

This yields the OH radicals due to the radical reaction between the high-concentration ozone gas and the unsaturated hydrocarbon gas inside the chamber, and further yields a reaction product due to a reaction (i.e., a gas phase reaction) between the OH radicals and the raw material gas. The reaction product is deposited on first film surface L0. This allows second film L2 to be formed with an intended thickness (e.g., thickness t2 in FIG. 2) on first film surface L0.

<Examples of Film Formation Target S>

Film formation target S may be variously configured as long as structured to allow oxide film L to be formed on film formation surface S1 by appropriately implementing the first film formation method and the second film formation method. For example, film formation target S may be a substrate, a film, a sheet, a cloth, a solid matter, or a resist formed on a substrate.

The first film formation method and the second film formation method allow oxide film L to be formed in a relatively low temperature state (e.g., 100° C. or lower). Thus, in case that film formation target S is a substrate, a film, or a resist, film formation target S is not limited to a substrate relatively high in heat resistance such as an Si substrate, but may be a substrate, a film, or a resist made of a synthetic resin relatively low in heat resistance, as a basis of an oxide film.

In case that film formation target S is a resist, the resist is exemplarily made of one of a resin, a low-heat-resistance glass, etc. with a curing temperature or a glass translation temperature Tg of 200° C. or lower. Otherwise, the resist may be made of a material deformable due to a radical source such as oxygen plasma.

In case that film formation target S is made of a resin, the resin may be one such as a polyester resin, an aramid resin, an olefin resin, a polypropylene, a PolyPhenylene Sulfide (PPS), or a PolyEthylene Terephthalate (PET).

As other examples, the resin may be a PolyEthylene (PE), a PolyEthylene Naphthalate (PEN), a PolyOxyMethylene (POM) (or an acetal resin), a PolyEtherEtherKetone (PEEK), an Acrylonitrile-Butadiene-Styrene copolymerized synthetic resin (ABS resin), a PolyAmide (PA), a tetrafluoroethylene-perfluoroalkoxyethylene copolymer (PFA), a PolyImide (PI), or a PolyVinyl Dichloride (PVD).

Film formation surface S1 of film formation target S is not limited to one shaped simply flat, but may be variously shaped. For example, as shown in FIG. 2, film formation target S may include a plurality of trench grooves S3 and have uneven steps on film formation surface S1.

Film formation target S may be appropriately adjusted in temperature by heating or cooling the film formation target S (or an inside of a chamber), for improvement in film formation performance. Specifically, film formation target S may be adjusted in temperature as needed such that the film formation temperature of film formation surface S1 falls within a range of about a room temperature to 100° C. (or about a room temperature to 80° C.).

<Examples of Raw Material Gas>

The raw material gas employed in the first film formation method and the second film formation method contains an element(s) to compose oxide film L, such as lithium (Li), magnesium (Mg), silicon (Si), titanium (Ti), vanadium (V), chromium (Cr), manganese (Mn), iron (Fe), cobalt (Co), nickel (Ni), copper (Cu), zinc (Zn), gallium (Ga), germanium (Ge), yttrium (Y), zirconium (Zr), molybdenum (Mo), ruthenium (Ru), rhodium (Rh), indium (In), tin (Sn), hafnium (Hf), tantalum (Ta), tungsten (W), iridium (Ir), platinum (Pt), lead (Pb), etc. Hereinafter, these elements are referred to as metals or metallic elements.

For example, the raw material gas may be one containing an organic silicon including an Si—O bond or an Si—C bond, or an organic metal including a metallic element-oxygen bond or a metallic element-carbon bond, or may be an organic metal complex or a hydride of a silicon or a metal.

More specifically, the raw material gas may be a silane (i.e., the generic name of hydrogen silicides), a Tetra EthylOrthoSillicate (TEOS), a TriMthoxySilane (TMS), a TriEthoxySilane (TES), a TriMethylAlminium (TMA), a Tetrakis(ethylmethylamino) zirconium (TEMAZ), a trisdimethylaminosilane (3DAMAS, $SiH[N(CH_3)_2]_3$), a Tetrakis(dimethylamino) titanium (TDMAT, $Ti[N(CH_3)_2]_4$), or a Tetrakis(dimethylamino) hafnium (TDMAH, $Hf[N(CH_3)_2]_4$). Otherwise, the raw material gas may be not one containing a single kind of a metallic element, but a heterogeneous polynuclear complex containing a plurality kinds of metallic elements (e.g., a complex disclosed in JP 2016-210742 A).

The raw material gas as exemplified above forms, for example, oxide film L (i.e., first film L1 and second film L2) that is an oxide film composed of one selected from a group of $Al_2O_3$, $HfO_2$, $TiO_2$, ZnO, $Ta_2O_3$, $Ga_2O_3$, $MoO_3$, $RuO_2$, $SiO_2$, $ZrO_2$, and $Y_2O_3$, or is an oxide film composed of the selected one wherein an element except O of the selected one is partially replaced with another element (e.g., $Si_{2-x}N_xO_2$ where X is within a range of $0<X<2$).

<Example of Ozone Gas>

The high-concentration ozone gas employed in the first film formation method and the second film formation method may be variously set in concentration, while it becomes more favorable with increase in concentration. Such high-concentration ozone gas can be yielded by liquefying and separating only ozone gas from ozone-containing gas with use of a difference in vapor pressure and thereafter vaporizing the liquefied ozone again. The yielding of the high-concentration ozone gas may be performed by commercially available devices such as a pure ozone generator (MPOG-HM1A1) made by Meidensha.

<Unsaturated Hydrocarbon Gas>

The unsaturated hydrocarbon gas employed in the second film formation method may be, for example, a hydrocarbon including a double bond (i.e., an alkene) such as ethylene, or a hydrocarbon including a triple bond (i.e., an alkyne) such as acetylene. In addition to ethylene and acetylene, also an unsaturated hydrocarbon with a low molecular weight (e.g., an unsaturated hydrocarbon with a carbon number n of 4 or lower) such as butylene is favorable as the unsaturated hydrocarbon.

<Example of Inert Gas>

In case of employing inert gas in the first film formation method and the second film formation method, the inert gas may be one such as $N_2$, Ar, or He.

<Example of Gas Supply Amount, Pressure, Etc.>

The raw material gas, the ozone gas, the unsaturated hydrocarbon gas, the inert gas, etc. supplied to the chamber may be appropriately controlled and set in conditions such as a supply amount of the inert gas, pressures of the respective gases (e.g., a partial pressure of the ozone gas inside the chamber), etc., as disclosed in Patent Documents 1 to 5. As an example, the conditions may be set in view of a kind and a shape of film formation target S in the chamber and kinds and concentrations of the respective gases.

<Example of Film Thickness of First Film L1 and Second Film L2>

The respective film thicknesses of first film L1 and second film L2 are not limited, but may be appropriately set depending on the film thickness of oxide film L to be formed. For example, in case that the intended film thickness of oxide film L is t3 as shown in FIG. 2, film thickness t1 of first film L1 is set to be sufficient for suppression of the in-film diffusion exposure, and film thickness t2 of second film L2 is set to satisfy a relation of $t2=t3-t1$.

For suppression of the in-film diffusion exposure, it is considered to be sufficient to set film thickness t1 of first film L1 to 2 nm or thicker, although it slightly varies depending on a kind of oxide film L (i.e., first film L1).

<Others>

The first film formation method and the second film formation method may be implemented with use of an ALD device and a CVD device prepared separately. Otherwise, because the ALD device and the CVD device respectively include gas supply systems similar to each other, the first film formation method and the second film formation method may be implemented with use of a single shared device such as a film formation device 1 as shown in FIG. 3. This allows the first film formation method and the second film formation method to be implemented by so-called in-situ (i.e., implementing the second film formation method without implementing any other processes after implementing the first film formation method).

Figure 3:
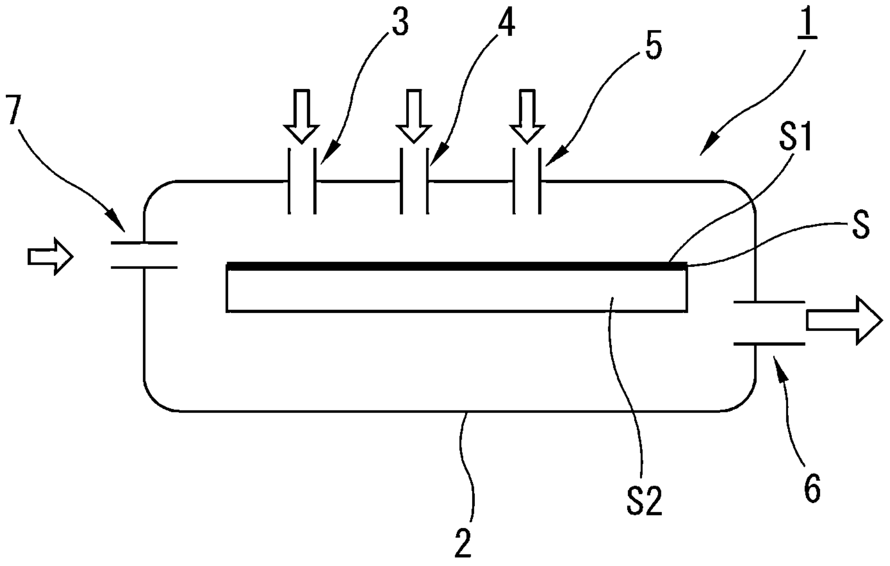
FIG. 3 is a schematic configuration view for illustration of a film formation device 1 applicable to the first film formation method and the second film formation method.

FIG. 3 schematically shows film formation device 1 configured by appropriately combining ALD devices and CVD devices disclosed in Patent Documents 1 to 4. Film formation device 1 includes a chamber 2, a raw material gas supply 3, an ozone gas supply 4, an unsaturated hydrocarbon gas supply 5, and a gas outlet 6. Chamber 2 is structured to contain film formation target S that is formed on an end face of an Si substrate S2 in case of FIG. 3. Raw material gas supply 3 is structured to supply raw material gas to an inside of chamber 2. Ozone gas supply 4 is structured to supply ozone gas to the inside of chamber 2. Unsaturated hydrocarbon gas supply 5 is structured to supply unsaturated hydrocarbon gas to the inside of chamber 2. Gas outlet 6 is structured to suck gas inside chamber 2 and discharge it into an outside of chamber 2.

Gas outlet 6 may be structured to not only suck gas inside chamber 2 and discharge it into the outside of chamber 2, but also maintain the inside of chamber 2 at a decompressed state (e.g., a state in which the inside of chamber 2 is in a vacuum). This allows the first film formation method and the second film formation method to be appropriately implemented with the inside of chamber 2 decompressed.

Patent Documents 1 to 4 disclose configurations similar to film formation device 1 as described above. Film formation device 1 may appropriately incorporate those configurations. For example, film formation device 1 in case of FIG. 3 includes an inert gas supply 7 structured to supply inert gas to the inside of chamber 2. This allows inert gas to be appropriately supplied to the inside of chamber 2 upon purge inside chamber 2. Inert gas supply 7 may be appropriately connected to raw material gas supply 3 and unsaturated hydrocarbon gas supply 5, which allows the inert gas to be used as carrier gas for raw material gas and unsaturated hydrocarbon gas.

In addition, although omitted in the drawing, film formation device 1 may further include a control section, a buffer function section (e.g., a buffer tank and a pressure meter), and/or a temperature adjustment section. The control section may be configured to adjust raw material gas supply 3, ozone gas supply 4, unsaturated hydrocarbon gas supply 5, and inert gas supply 7 in supply flow amount, supply flow amount ratio, supply time, etc. of respective gases. The buffer function section may be structured to temporarily store respective gases before supplying them to the inside of chamber 2. The temperature adjustment section is structured to adjust film formation target S (or the inside of the chamber) in temperature (e.g., adjust at or below 100° C.) by heating or cooling.

Furthermore, at least two out of raw material gas supply 3, ozone gas supply 4, unsaturated hydrocarbon gas supply 5, and inert gas supply 7 may be integrated to form a shower head structured to supply respective gases to the inside of chamber 2.

<Test>

As follows, a test for forming oxide film L of $SiO_2$ on film formation surface S1 was implemented. Film formation target S was a resist formed on Si substrate S2 and shaped uneven in an intended pattern. The first film formation method and the second film formation method were implemented with use of film formation device 1 shown in FIG. 3. In the first film formation method and the second film formation method, film formation surface S1 of film formation target S (and the inside of chamber 2) was maintained at or below 100° C. in temperature with the inside of chamber 2 decompressed. Film thickness t1 of first film L1 was set to fall within a range of 2 nm to 10 nm. The resist was made of a resin or a low-heat-resistance glass with a curing temperature or a glass translation temperature Tg of 200° C. or lower.

Figure 4:
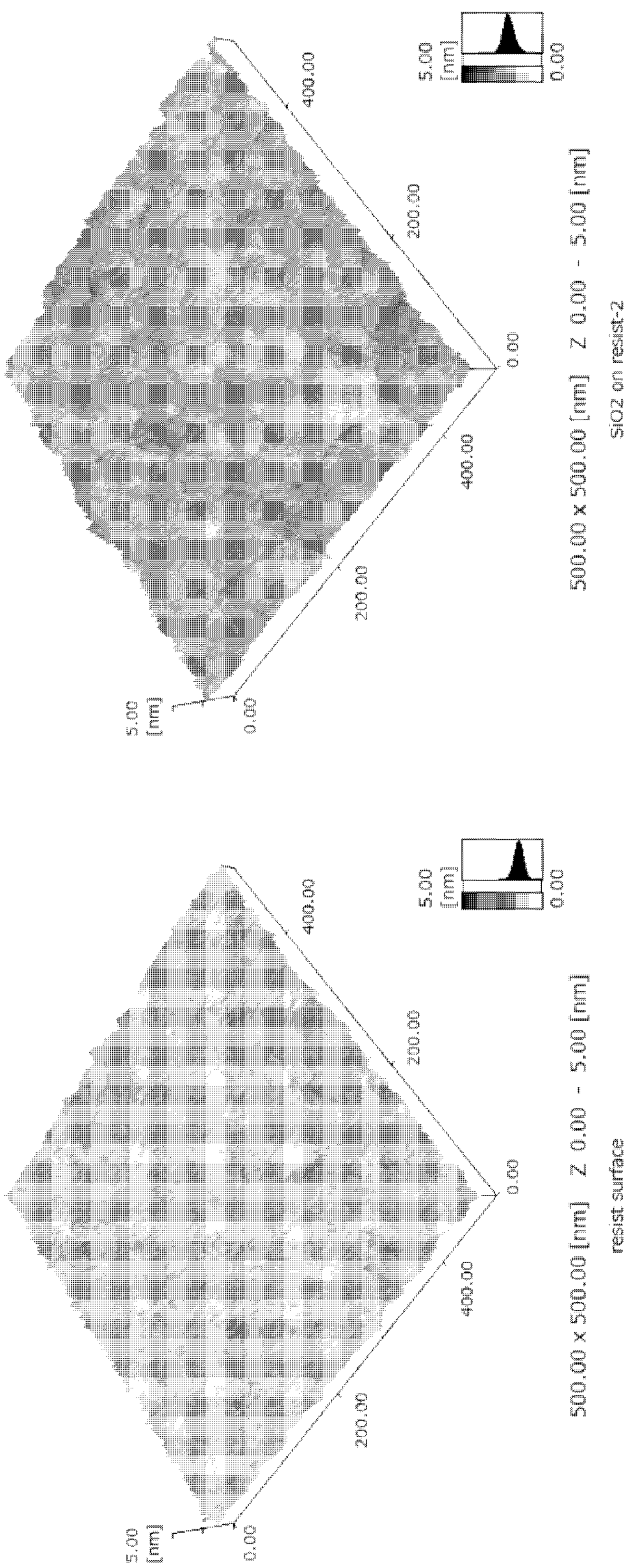
FIG. 4 is a view showing AFM observation results. (A) shows surface roughness of a part of a film formation surface S1 before forming an oxide film L. (B) shows surface roughness of a part of the oxide film L.

Oxide film L formed as described above was observed and confirmed to have intended film characteristics. FIG. 4 shows results of observations of both of surface roughness of film formation surface S1 before forming oxide film L and surface roughness of oxide film L, with use of an Atomic Force Microscope (AFM). FIG. 4(A) shows the surface roughness of film formation surface S1 before forming oxide film L. FIG. 4(B) shows the surface roughness of oxide film L. By comparing these results, a shape change rate of film formation target S before and after forming oxide film L was calculated to be 1% or lower in dimensional ratio. This shows that the first film formation method and the second film formation method allow oxide film L to be intendedly formed without deformation, denaturation, etc. of film formation target S.

The above details only the specific embodiments according to the present invention. However, the embodiments may be variously modified within scope of technical ideas of the present invention. Also such modifications naturally belong to scope of the present claims.

The invention claimed is:

1. An oxide film formation method for forming an oxide film on a film formation surface of a film formation target contained in a chamber, the oxide film formation method comprising:
- forming the oxide film such that the oxide film includes a first film formed on the film formation surface to have a film thickness of 2 nm or thicker and a second film formed on a surface of the first film, wherein:
- the first film is formed by a first film formation method being an atomic layer deposition method and including a first raw material gas supply process, a first raw material gas purge process, a first oxidizer supply process, and a first oxidizer purge process;
- the first raw material gas supply process includes supplying to an inside of the chamber, raw material gas containing an element to compose the oxide film, and forming a first adsorption layer of the raw material gas on the film formation surface;
- the first raw material gas purge process includes removing from the film formation surface, excess gas of the raw material gas supplied in the first raw material gas supply process and gas yielded due to adsorption of the raw material gas on the film formation surface;
- the first oxidizer supply process includes supplying ozone gas of 80 volume % or higher to the inside of the chamber and oxidizing the first adsorption layer;
- the first oxidizer purge process includes removing from the film formation surface, excess gas of the ozone gas supplied in the first oxidizer supply process and gas yielded due to oxidation of the first adsorption layer;
- the second film is formed by a second film formation method being an atomic layer deposition method different from the first film formation method or being a chemical vapor deposition method; and
- the second film formation method employs as an oxidizer, OH radicals yielded by a radical reaction between ozone gas of 80 volume % or higher and unsaturated hydrocarbon gas.

2. The oxide film formation method as claimed in claim 1, wherein:
- the second film formation method is the atomic layer deposition method different from the first film formation method, and includes a second raw material gas supply process, a second raw material gas purge process, a second oxidizer supply process, and a second oxidizer purge process;
- the second raw material gas supply process includes supplying to the inside of the chamber, raw material gas containing the element to compose the oxide film, and forming a second adsorption layer of the raw material gas on the surface of the first film;
- the second raw material gas purge process includes removing from the surface of the first film, excess gas of the raw material gas supplied in the second raw material gas supply process and gas yielded due to adsorption of the raw material gas on the surface of the first film;
- the second oxidizer supply process includes supplying the ozone gas of 80 volume % or higher and the unsaturated hydrocarbon gas to the inside of the chamber and oxidizing the second adsorption layer; and
- the second oxidizer purge process includes removing from the surface of the first film, excess gas of the ozone gas and the unsaturated hydrocarbon gas supplied in the second oxidizer supply process and gas yielded due to oxidation of the second adsorption layer.

3. The oxide film formation method as claimed in claim 1, wherein the second film formation method is the chemical vapor deposition method, and includes supplying to the inside of the chamber, the ozone gas of 80 volume % or higher and the unsaturated hydrocarbon gas and raw material gas containing the element to compose the oxide film.

4. The oxide film formation method as claimed in claim 1, wherein the film formation target is maintained at or below 100° C. in temperature.

5. The oxide film formation method as claimed in claim 1, wherein the film formation target is made of a resin or a low-heat-resistance glass having a curing temperature or a glass translation temperature Tg of 200° C. or lower.

6. The oxide film formation method as claimed in claim 1, wherein each of the first film and the second film is an oxide film of one selected from a group of $Al_2O_3$, $HfO_2$, $TiO_2$, ZnO, $Ta_2O_3$, $Ga_2O_3$, $MoO_3$, $RuO_2$, $SiO_2$, $ZrO_2$, and $Y_2O_3$, or an oxide film of the selected one an element except O of which is partially replaced with another element.

7. The oxide film formation method as claimed in claim 1, wherein:
- the chamber includes:
  - a raw material gas supply structured to supply the raw material gas to the inside of the chamber;
  - an ozone gas supply structured to supply the ozone gas to the inside of the chamber;
  - an unsaturated hydrocarbon gas supply structured to supply the unsaturated hydrocarbon gas to the inside of the chamber; and
  - a gas outlet structured to suck gas inside the chamber and discharge the gas into an outside of the chamber; and
- each of the first film and the second film is formed in a state in which the inside of the chamber is decompressed.

* * * * *